United States Patent [19]
Geis et al.

[11] Patent Number: 5,350,944
[45] Date of Patent: Sep. 27, 1994

[54] INSULATOR FILMS ON DIAMONDS

[75] Inventors: Michael W. Geis, Acton; Daniel L. Smythe, Swampscott, both of Mass.

[73] Assignee: Massachusetts Institute of Technology, Cambridge, Mass.

[21] Appl. No.: 839,487

[22] Filed: Feb. 20, 1992

Related U.S. Application Data

[63] Continuation-in-part of Ser. No. 293,880, Jan. 3, 1989, abandoned.

[51] Int. Cl.$^5$ .................. H01L 27/01; H01L 29/00; H01L 29/78
[52] U.S. Cl. ..................... 257/77; 257/288; 257/289; 257/405
[58] Field of Search ............... 257/77, 289, 288, 410, 257/405

[56] References Cited

U.S. PATENT DOCUMENTS

| | | | |
|---|---|---|---|
| 3,603,848 | 9/1971 | Sato et al. | 317/235 |
| 3,612,960 | 10/1971 | Takeishi | 317/235 |
| 3,634,737 | 1/1972 | Maeda | 257/627 |
| 4,085,499 | 4/1978 | Kuninobu et al. | 29/571 |
| 4,296,144 | 10/1981 | Maby et al. | 427/38 |
| 4,315,097 | 2/1982 | Solomon | 136/255 |
| 4,378,629 | 4/1983 | Bozler et al. | 29/580 |
| 4,511,783 | 4/1985 | Burgemeister | 219/121 |
| 4,571,447 | 2/1986 | Prins | 136/252 |
| 4,638,347 | 1/1987 | Iyer | 257/327 |
| 4,646,282 | 2/1987 | Mizuno et al. | 369/124 |
| 4,843,034 | 6/1989 | Herndon et al. | 437/189 |
| 5,002,899 | 3/1990 | Geis et al. | 437/173 |

FOREIGN PATENT DOCUMENTS

| | | | |
|---|---|---|---|
| 0086022 | 8/1983 | European Pat. Off. | 257/77 |
| 445998A1 | 9/1991 | European Pat. Off. | 257/77 |
| 59-208821 | 11/1984 | Japan | 257/77 |
| 59-213126 | 12/1984 | Japan | 257/77 |
| 60-246627 | 12/1985 | Japan | 257/77 |
| WO90/03661 | 4/1990 | PCT Int'l Appl. | 257/77 |
| WO90/07796 | 7/1990 | PCT Int'l Appl. | 257/77 |

OTHER PUBLICATIONS

Williams et al., "Impurity Conduction in Synthetic Semiconducting Diamond", *Journal of Physics C: Solid State Physics*, 3:1727 (1970).

Collins et al., "Role of Phonons in the Oscillatory Photoconductivity Spectrum of Semiconducting Diamond", *Physical Review*, vol 183, No. 3, p. 725, (1969).

Custers, "Type IIb Diamonds", *Physica XX*, p. 183, (1954).

Fujimori et al., "Characterization of Conducting Diamond Films", *Vacuum*, p. 99, 1980.

Lightowlers et al., "Electrical Transport Measurements on Synthetic Semiconducting Diamond", *Physical review*, vol. 151, No. 2, p. 685, (1966).

Bazhenov et al., "Synthetic Diamonds in Electronics (Review)", *Sov. Phys. Semicond.*, 19(A), p. 829, (1985).

Glover, "The C-V Characteristics of Schottky Barriers on Laboratory Grown Semiconducting Diamonds", *Solid State Electronics*, 16:973, (1973).

(List continued on next page.)

*Primary Examiner*—Sara W. Crane
*Assistant Examiner*—D. Monin
*Attorney, Agent, or Firm*—Fish & Richardson

[57] ABSTRACT

Electrical quality insulating films on n-type and p-type diamond substrates are provided in which an insulating film such as a silicon dioxide film is deposited onto the exposed face of a diamond substrate, such as by chemical vapor deposition. Forming a conducting layer atop the silicon dioxide allows the creation of a metal-oxide-silicon device with which semiconductor carriers can be controlled through the application of a bias voltage to the conductor surface.

19 Claims, 14 Drawing Sheets

OTHER PUBLICATIONS

Prins, "Bi-Polar Transistor Action in Ion-Implanted Diamond", *Applied Physical Letters*, 41(10):950, (1982).

Moazed, "Ohmic Contacts to Semiconducting Diamond", (Feb. 22, 1988).

Moazed et al., "Electrical Contacts to Semiconducting Diamond", *Fiscal Year '87 Annual Report SDIO/ONR Crystaline Carbon Materials*, (1987).

Rothschild, "Excimer-Laser Etching of Diamond and Hard Carbon Films by Direct Writing and Optical Projection", *Journal of Vacuum Science Technology*, B4(1), p. 310, (1986).

Vavilov, "Electronic and Optical Processes in Diamond", *Nauka Publishing House, Moscow Office of Physico-Mathematical Literature*, (1985).

Geis et al., "Crystalline Silicon on Insulator by Graphoepitaxy", *IEEE*, (1979).

Geis et al., "Device Application of Diamonds", *J. Vac. Sci. Tech.*, May/Jun. 1988, pp. 1953–1956.

"Semiconductor Devices" by Sze Copyright 1985, p. 160.

Geis et al., "Capacitance-Voltage Measurements on Metal-SiO$_2$-Diamond Structures Fabricated with (100- and (111)-Oriented Substrates", *IEEE Transactions on Electron Devices*, vol. 38, No. 3, Mar. 1991 pp. 619–626.

Collins, "Diamond Electronic Devices-A Critical Appraisal", *Semicond. Sci. Technol.*, 1989, United Kingdom, pp. 605–611.

Geis et al., "High-Temperature Point-Contact Transistors and Schottky Diodes Formed on Synthetic Boron-Doped Diamond", *IEEE Electron Device Letters*, vol. EDL-8, No. 8, Aug., 1987, pp. 341–343.

Lile, "Metal-Insulator-GaAs Structures", *Gallium Arsenide Materials, Devices, and Circuits*, 1985, pp. 263–298.

INSULATOR FILMS ON DIAMONDS

STATEMENT AS TO FEDERALLY SPONSORED RESEARCH

The U.S. Government has non-exclusive rights in this invention pursuant to contract number F19628-85-C-0002 awarded by the Department of the Air Force.

CROSS REFERENCE TO RELATED APPLICATIONS

This application is a continuation-in-part of U.S. Ser. No. 07/293,880, filed Jan. 3, 1989, now abandoned the contents of which are incorporated by reference.

FIELD OF THE INVENTION

This invention relates to the fabrication of silicon dioxide and other insulating films on diamond.

BACKGROUND OF THE INVENTION

Diamond is a material with semiconductor properties that are superior to Silicon (Si), Germanium (Ge) or Gallium Arsenide (GaAs), which are now commonly used in semiconductor devices. In particular, diamond provides a higher band gap, a higher breakdown voltage and a greater saturation velocity which produces a substantial increase in its projected cutoff frequency and maximum operating voltage compared to devices fabricated from Si, Ge, or GaAs. Furthermore, diamond has the highest thermal conductivity of any solid at room temperature and excellent conductivity over a temperature range up to and beyond 500° k. Diamond therefore holds the potential for efficient semiconductor operation at high frequency and power. Finally, diamond, by virtue of its small molecular size compared to other materials, provides a smaller neutron cross section which reduces its degradation rate in radioactive environments.

To date, these advantages of diamond as a semiconductor have not been exploited, in part because of the difficulty in forming electrical contacts on diamond surfaces which allow access to and control of diamond semiconductor devices. It is desirable to form both ohmic contacts (i.e., those whose resistance to current flow is symmetrical with respect to direction of flow) and diode-type Schottky contacts (i.e., those whose resistance to current flow is asymmetrical). It is also desirable to form insulating films on diamond which might be used, for example, in metal-oxide-semiconductor (MOS) devices.

One method for forming ohmic contacts on diamond may be found in U.S. Pat. No. 5,002,899 by Geis et al., entitled: "Electrical Contacts on Diamond." Known methods for forming Schottky contacts on diamond involve direct application of metals to p-doped diamond substrates as discussed in "Electronic and Optical Processes in Diamond", Nauka Publishing House, Moscow Office of Physio-Mathematical Literature, Moscow, 1985 by Vavilov et al. Presently, the inventors are not aware of a prior method for the information of high quality insulating films on diamond substrates, or formation of Schottky contacts upon such films.

Notwithstanding the foregoing, the formation of insulating silicon dioxide films on silicon semiconductor substrates is well known. Silicon dioxide ($SiO_2$) is a particularly desirable insulator because of its inherent high insulating properties, and its compatibility with silicon wafer processing.

Several methods of forming these films are available. For example, silicon dioxide may be deposited on a silicon substrate by either thermal or plasma chemical vapor deposition (CVD). Using this technique, decomposition of a mixture such as of an oxygen-containing and silicon-containing gas or gasses by plasma or heat produces silicon and oxygen atoms which react to form silicon dioxide. The latter is then deposited onto a substrate surface held in the reaction region. In another method, known as the "Spin on Glass" technique, an organic compound containing a silicon oxide moiety is applied to the substrate surface and is then heated. The organic component is cleaved from the silicon oxide moiety and then removed from the surface by evaporation or sublimation while the silicon radical reacts with ambient oxygen to produce a film of silicon dioxide. Finally, in the "thermal growth" method, which is only applicable to a silicon substrate, such a substrate is heated to temperatures in a range of 900° C.–1200° C. in an oxygen atmosphere to form a silicon dioxide film directly on its exposed surface.

Critical to the formation of a device quality insulating film for use in semiconductors are the particular properties of the interface between the insulator and the semiconductor. In non-critical applications, the interface is known to contain interface surface states which are thought to arise from interruptions in the lattice structures at the surface of the insulator and are capable of changing charge by acceptance or donation of charge carriers (holes or electrons) from the semiconductor. These states are affected by voltages applied through the insulator and thereby degrade control of the carriers in the semiconductors. The presence or absence of these interface states is known to be highly dependent both on the nature of the semiconductor as well as on the method used to obtain the insulating film.

SUMMARY OF THE INVENTION

According to the present invention, a method is provided for creating an insulating film on a diamond substrate, by providing a prepared p-type diamond substrate and depositing an insulating film (which may be $SiO_2$, or in an n-type device, $BaF_2$ or $CaF_2$, for example) onto the surface of the substrate. According to various aspects of the invention, the method further includes the step of depositing a conductive layer upon the insulator. Preferably, the conducting layer is doped polysilicon, or alternatively the conductive layer is a metal, preferably aluminum, chrome-gold or Tungsten.

The deposition of the insulator film may be performed by plasma CVD or thermal CVD, and in a particularly preferred embodiment the thermal CVD is carried out at 620° C. using a gas mixture including $SiH_4$, $O_2$ and $N_2$, with the total pressure being near atmospheric pressure.

According to other aspects of the invention, the thickness of the insulator is controlled. In preferred embodiment the insulator is silicon dioxide and its thickness is less than or equal to approximately 100 nanometers.

According to another embodiment of the invention, a semiconductor device is provided comprising the diamond substrate having a film formed thereon of CVD deposited silicon dioxide. The device according to other embodiments further comprises a conducting layer on the silicon dioxide film, preferably the conducting layer is doped polysilicon, or the conducting layer is a metal, preferably aluminum, chrome-gold or tungsten.

According to another aspect of the invention, the insulating layer is less than or equal to approximately 10 nanometers thick and the device forms a Schottky-type contact.

According to another aspect, the invention features a method for forming a diamond semiconductor device having an insulating film on a diamond semiconductor substrate, including the steps of providing a diamond semiconductor substrate, and depositing a non-diamond insulating film onto the surface of the substrate.

In various preferred embodiments, the deposition of the insulating film is performed by plasma CVD. The deposition of the insulating film is performed by thermal deposition. The method includes cleaning the surface of the substrate on which the insulating film is to be deposited. The method includes the step of depositing a conductive layer upon the insulating film. The conducting layer is selected from the group consisting of doped polysilicon and a metal. The metal is aluminum chrome-gold or tungsten. The insulating film is selected from the group consisting of $SiO_2$, $BaF_2$ or $CaF_2$. The film thickness is between about 10 to 100 nanometers. The film thickness is about 10 nm or less.

In another aspect, the invention features a method for forming diamond semiconductor device having an insulating film on a semiconductor diamond substrate, including the steps of providing a p-type diamond substrate, depositing a non-diamond insulating film onto the surface of the substrate and, depositing a conductive layer upon the insulating film.

In various embodiments the diamond substrate has (100) surface and the insulating film is deposited on the surface. The insulating film is $SiO_2$. The insulating film is selected from the group consisting of $BaF_2$ or $CaF_2$. The method includes incorporating the device into a depletion mode field effect transistor. The diamond substrate has (111) surface and the insulating film is deposited on the H surface, the insulating film is $SiO_2$ and the method includes employing the device as a cold cathode. The deposition of the insulating film is performed by plasma CVD. The deposition is performed at a deposition temperature around 400°–625° C. The method includes depositing the film of sufficient thickness to inhibit substantial tunneling of charge carriers through the film. The film is between about 10 to 100 nm thick. The film is deposited to a thickness of about 10 nm or less to enable tunneling through the film. The method includes cleaning the surface of the substrate on which the insulating film is to be deposited. The conducting film is selected from the group consisting of polysilicon or a metal.

In another aspect, the invention features, a method for forming a diamond semiconductor device having an insulating film on a semiconductor diamond substrate, using the steps of providing an n-type diamond substrate, depositing a non-diamond insulating film onto the surface of the substrate, and depositing a conductive layer upon the insulating film.

In various preferred embodiments, the insulating film is selected to have a conduction band energy greater than the diamond substrate. The insulating film is selected from the group consisting of $CaF_2$ and $BaF_2$. The conducting layer is selected from the group consisting of doped polysilicon and a metal.

In another aspect, the invention features a semiconductor device including a p-type diamond semiconductor substrate having a (100) surface and a means for controlling semiconductor charge carriers, the means includes a non-diamond insulating film on the (100) surface of the diamond substrate, and a means for imposing an electric field in the substrate through the film, the film enabling the formation of a predetermined depletion region in the substrate for control of the mobile carriers in the diamond substrate when electrical fields are imposed on the film.

In various preferred embodiments, the film is $SiO_2$. The device includes a conducting layer on the insulating film. The conducting layer is selected from the group consisting of doped polysilicon and a metal. The metal is aluminum, chrome-gold or tungsten. The thickness of the film is determined to inhibit substantial tunneling of charge carriers through the film. The device is incorporated into a depletion mode field effect transistor. The the thickness of the film is between about 10 to 100 nm. The thickness of the insulating film is less than or equal to approximately 10 nanometers for forming a rectifying contact.

In another aspect the invention features a semiconductor device including a diamond semiconductor substrate having a (111) surface and means for controlling semiconductor charge carriers, the means includes a non-diamond insulating film on the (111) surface of the diamond substrate, and a means for imposing an electric field in the substrate through the film, the film enabling control of the mobile carriers in the diamond substrate when electrical fields are imposed on the film.

In various preferred embodiments, the film is comprised of $SiO_2$. The device is a conducting layer on the insulating film. The conducting layer is selected from the group consisting of doped polysilicon or a metal. The metal is aluminum, chrome-gold or tungsten. The device is incorporated in a cold cathode. The film is selected from $CaF_2$ and $BaF_2$.

Other features follow.

DESCRIPTION OF THE PREFERRED EMBODIMENTS(S)

Drawings

Figure 9A:
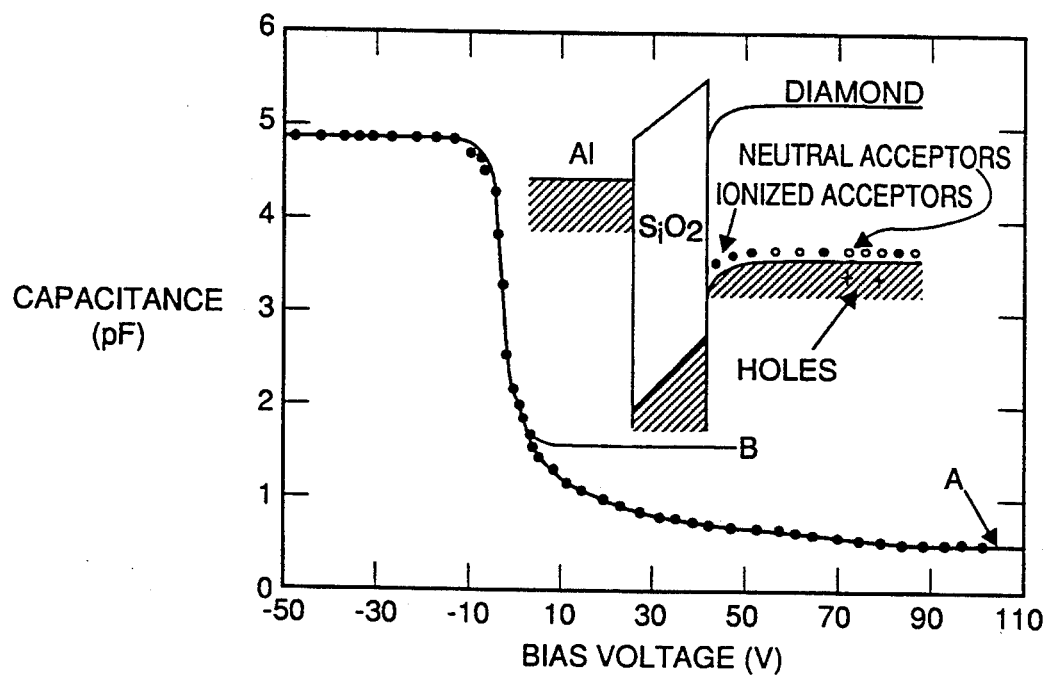
Figure 9B:
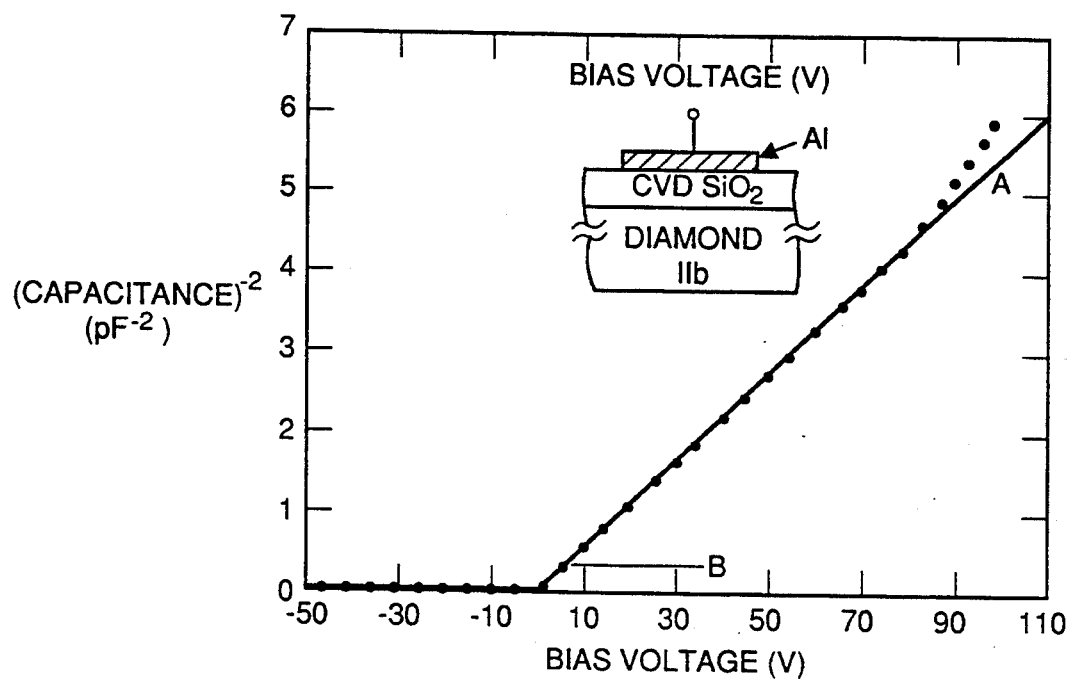

FIGS. 9a and 9b are graphs of theoretical and experimental C-V data for (100)-oriented diamond substrate plotted as (9a) C versus bias voltage and (9b) $C^{-2}$ versus bias voltage. The substrate was held at 250° C. Capacitance was determined with a 10-kHz signal. Calculated data (curves A and B) were fitted to experimental data (points) by assuming $N_A = 1.2 \times 10^{16}$ cm$^{-3}$, d=89 5 nm, and $V_{FB} = 3.12$ V. For curve B, $n_{po} = 4 \times 10^{-23}$ cm$^{-3}$. Note that the curves coincide for bias voltages <0 V. The insert in FIG. 9a shows energy levels of a metal-SiO$_2$-diamond structure biased into depletion. The insert in FIG. 9b is a schematic drawing of a metal-SiO$_2$-diamond structure with a 100×150 μm electrode.

Figure 10:
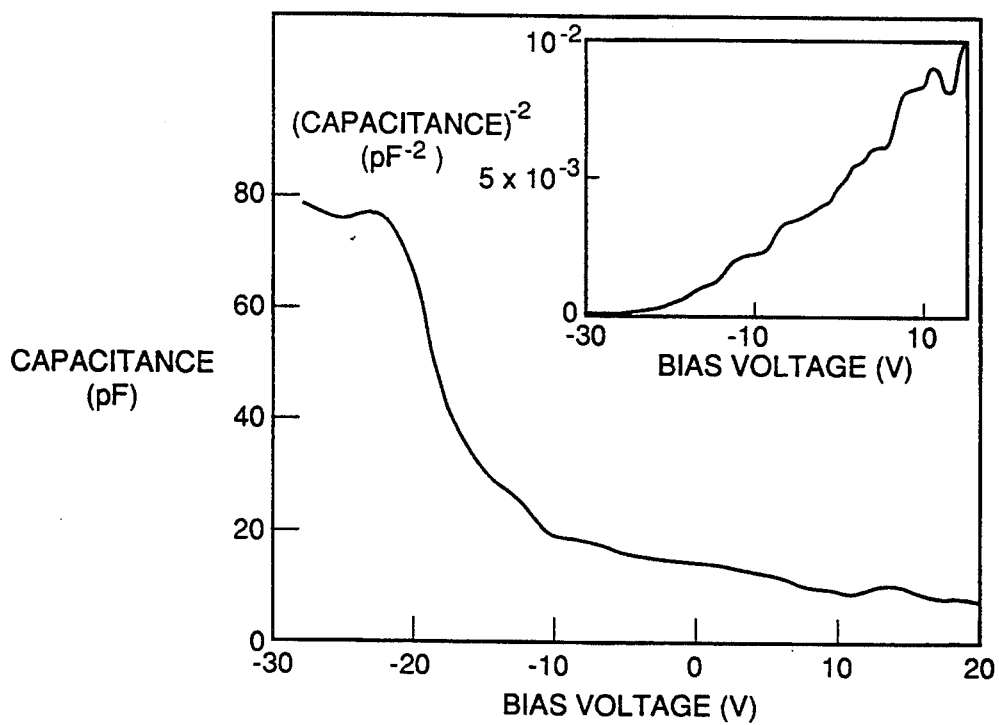
Figure 11:
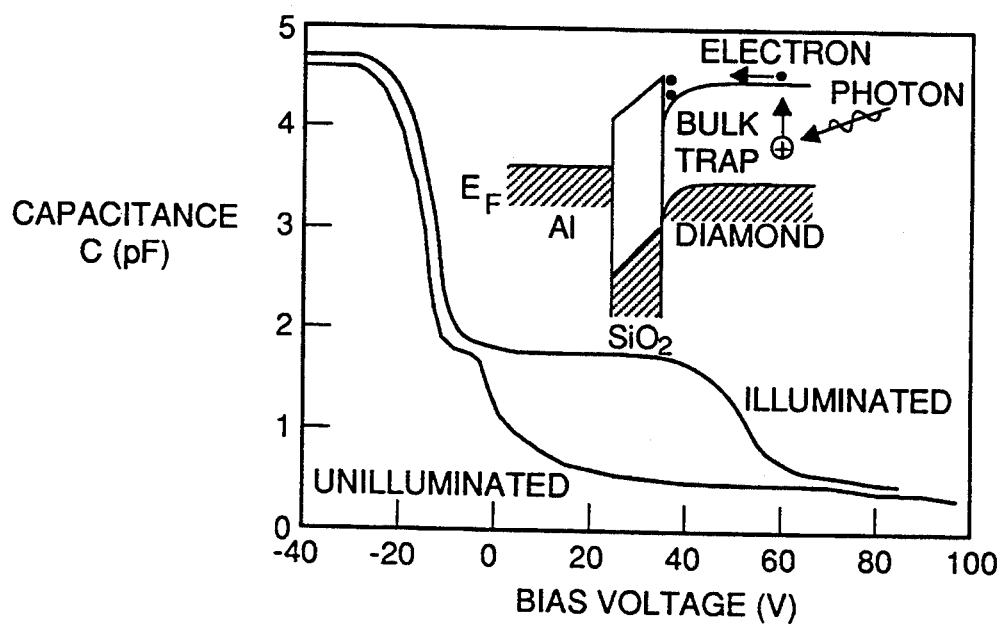
Figure 12:
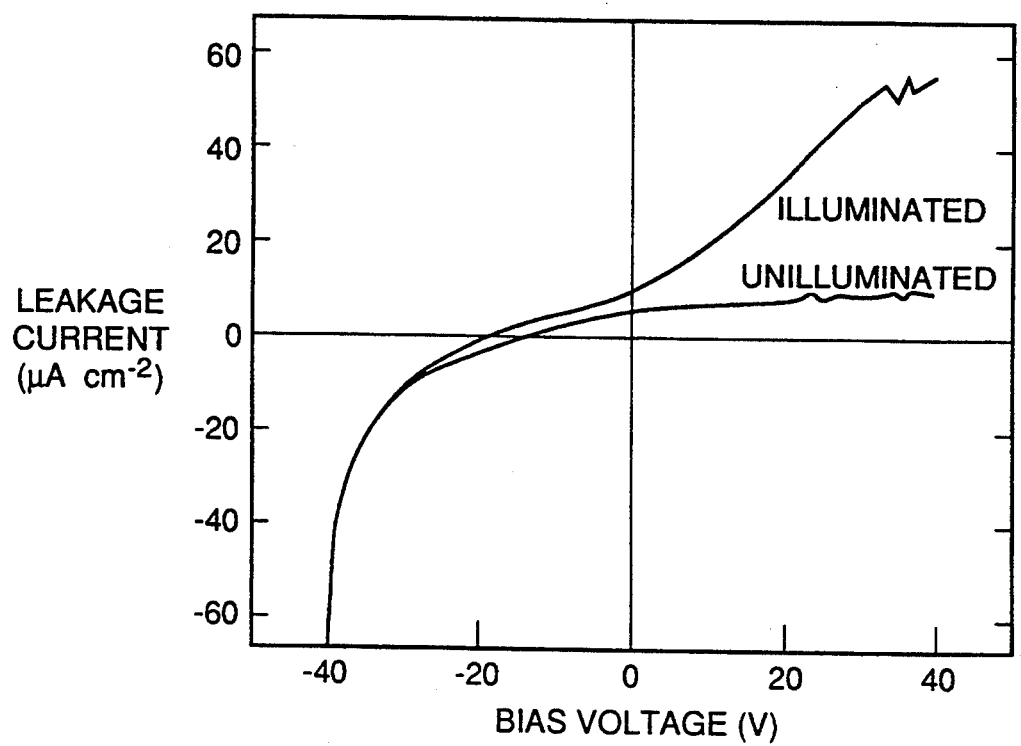
Figure 13A:
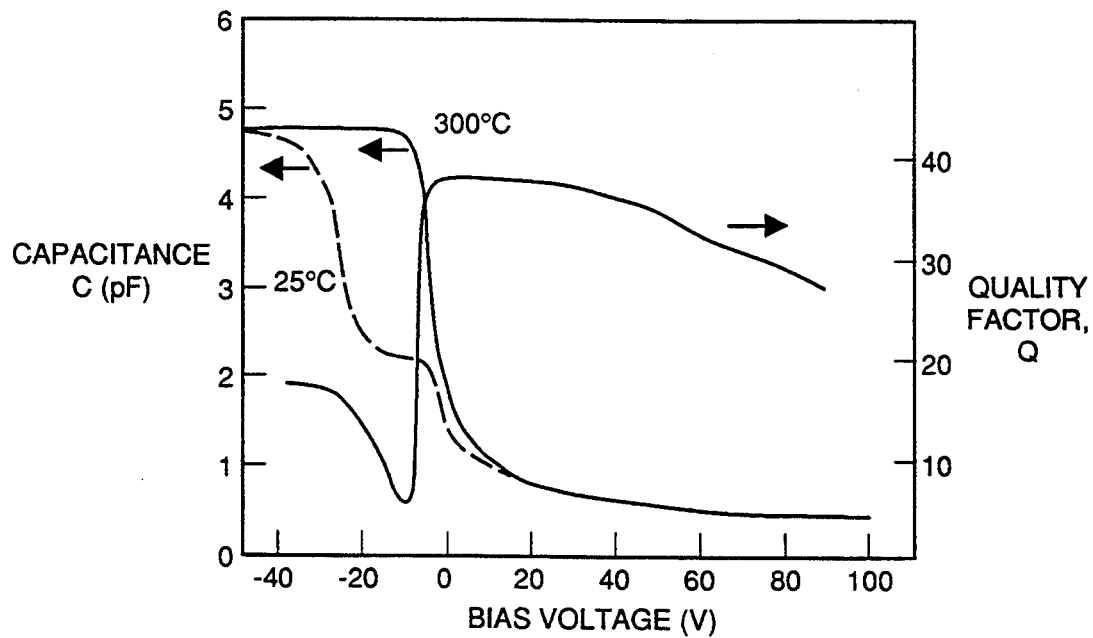
Figure 13B:
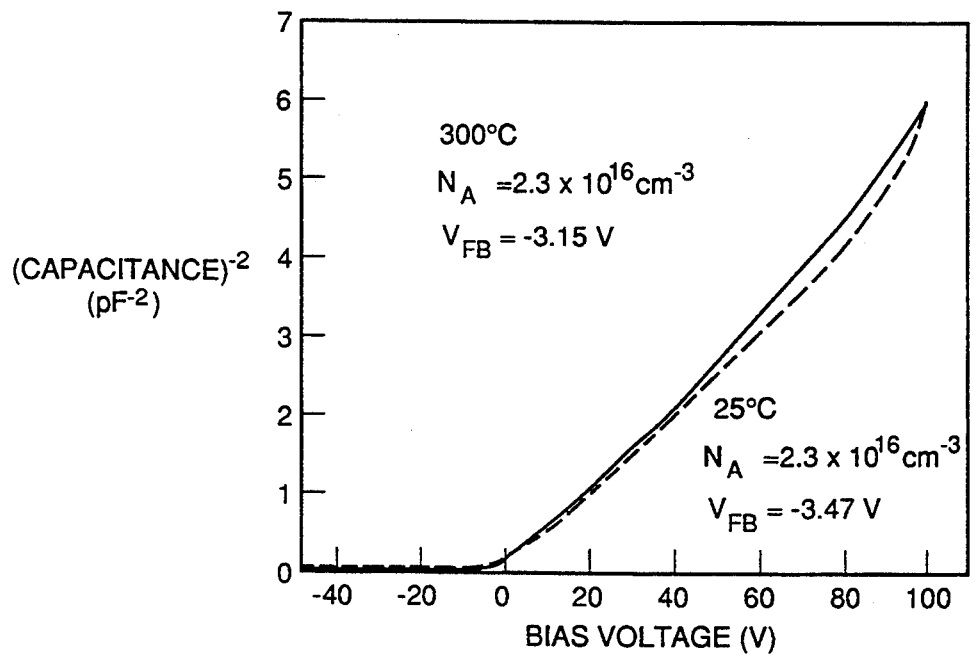
Figure 14:
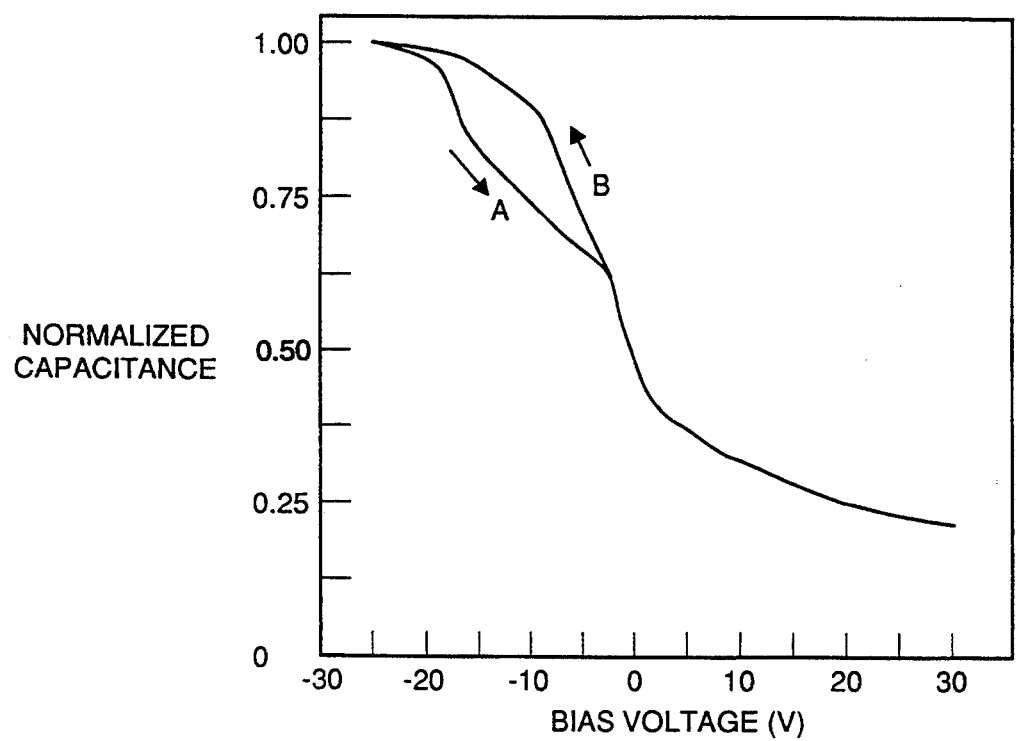
Figure 15:
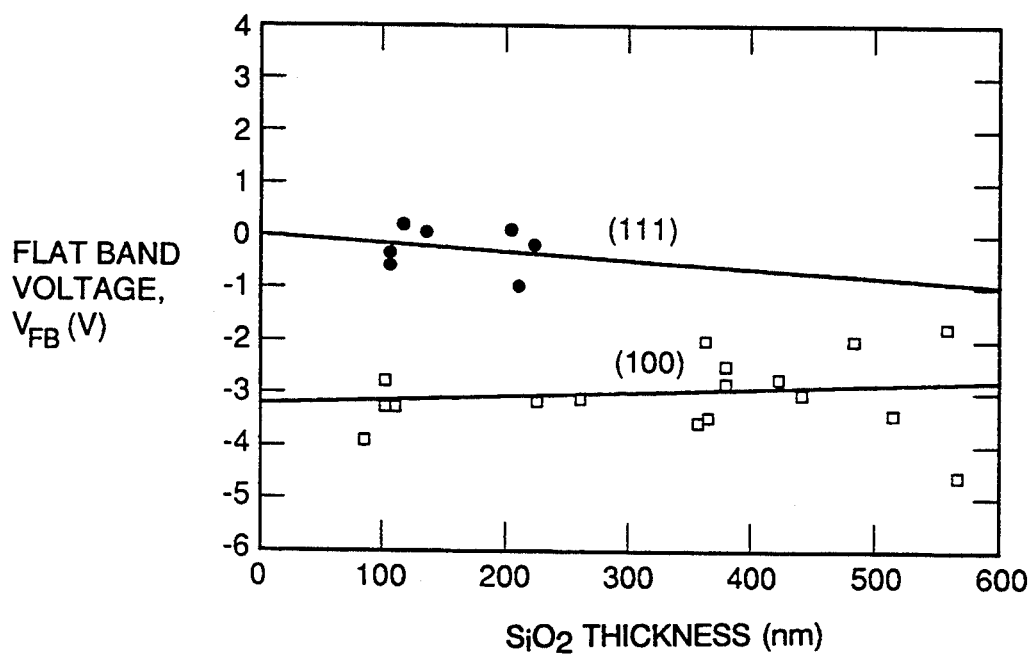
Figure 16:
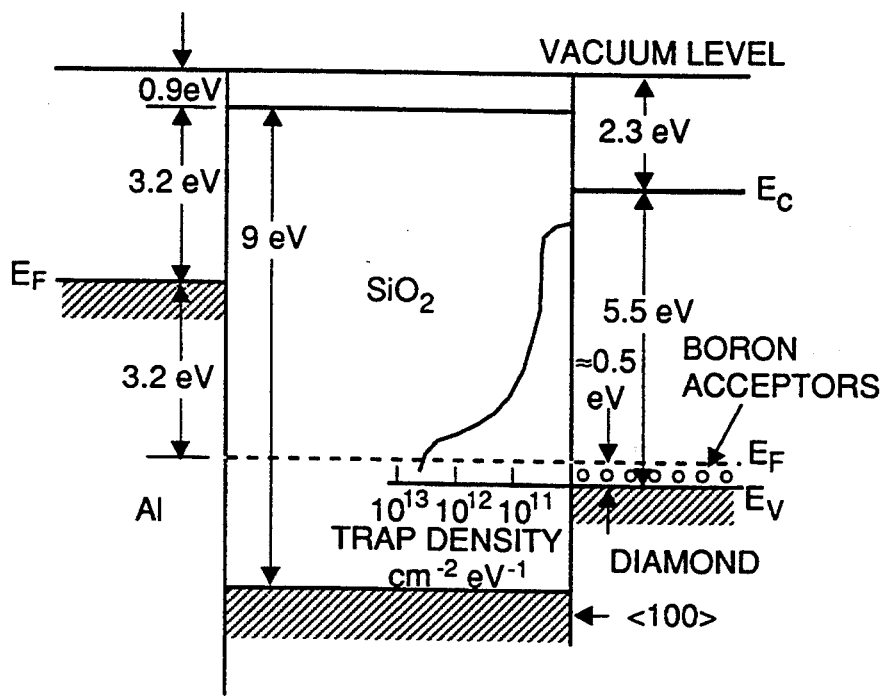
Figure 17A:
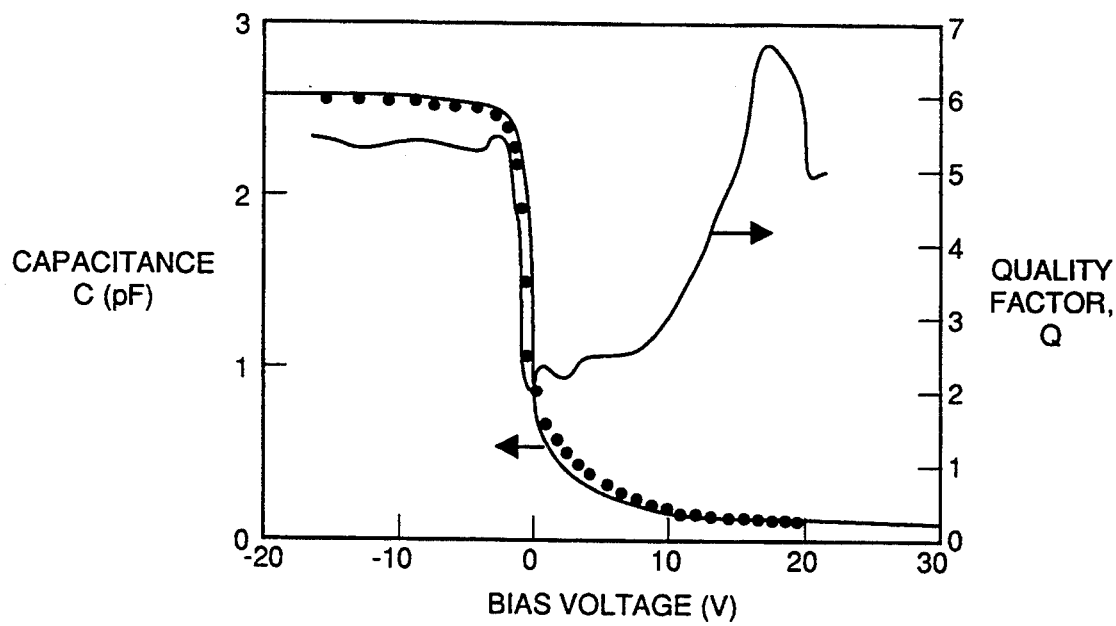
Figure 17B:
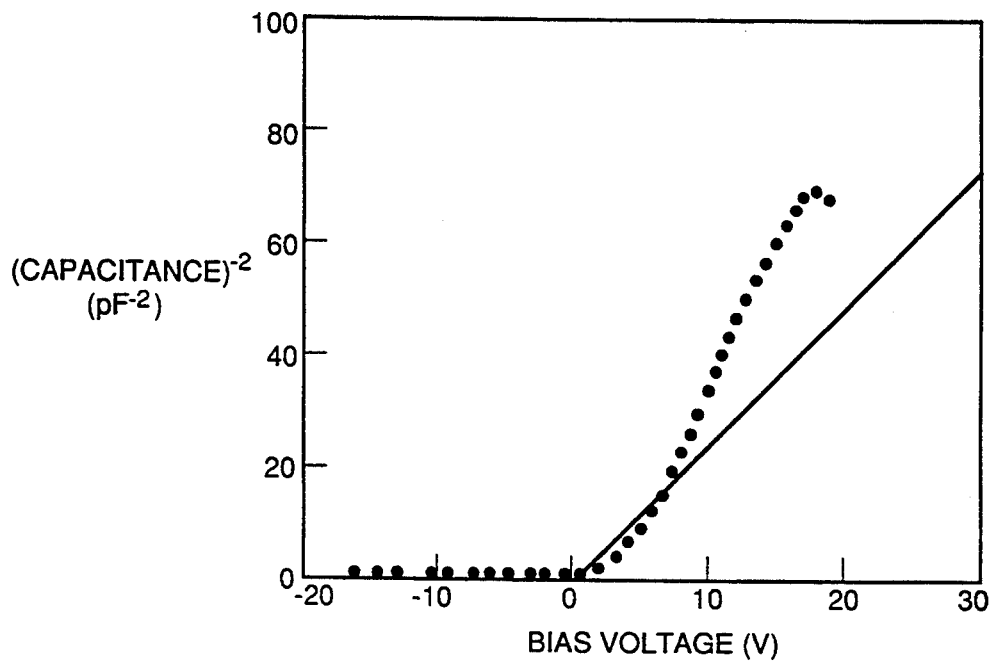
Figure 18:
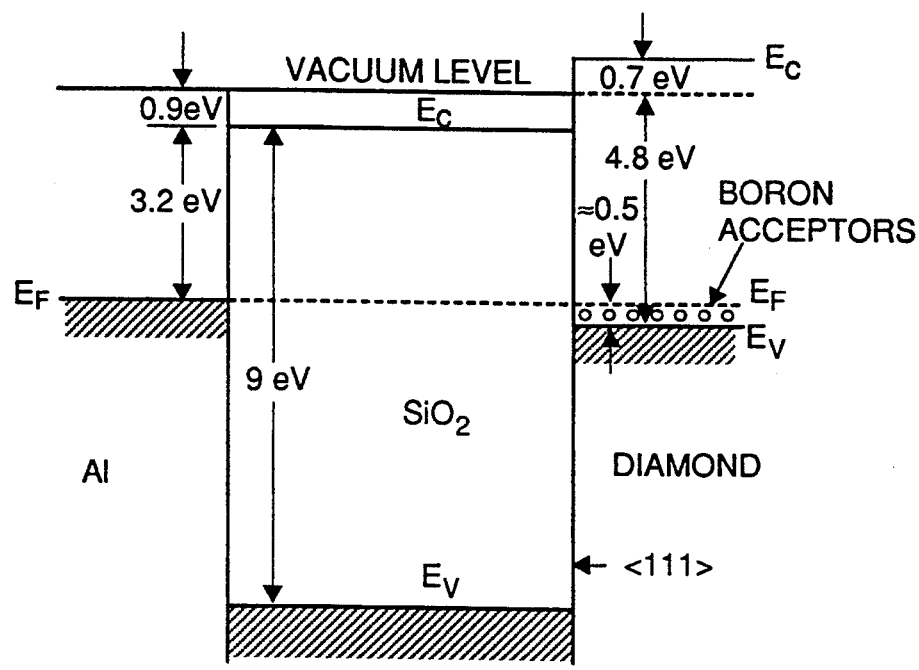
Figure 19:
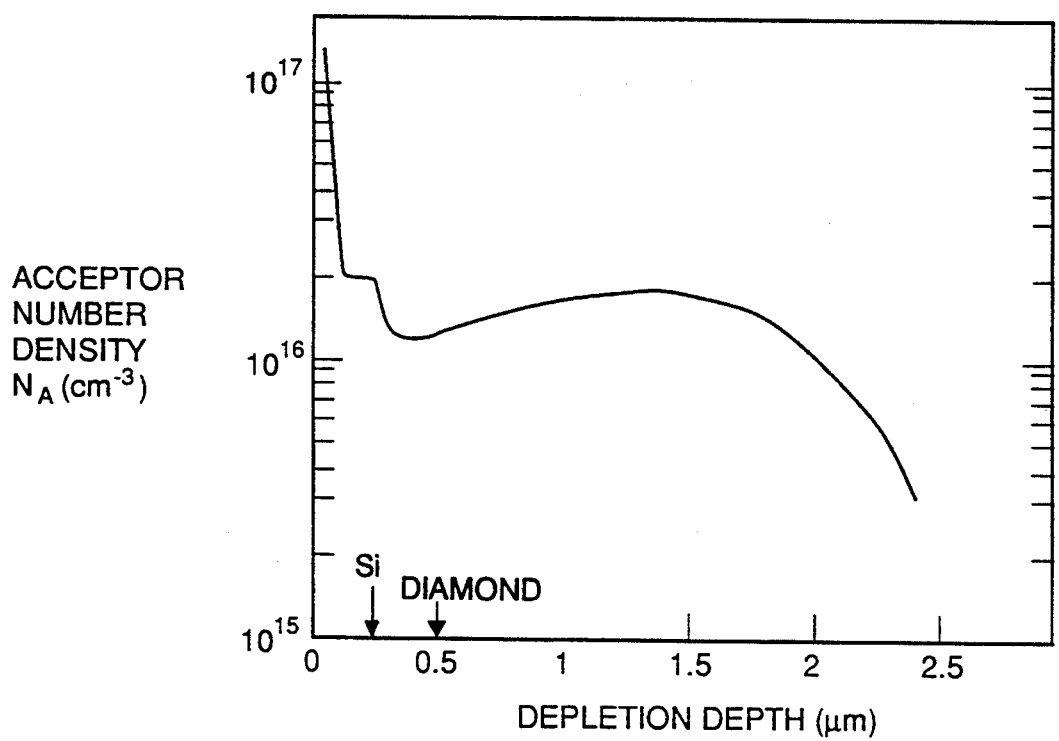

FIG. 10 is a graph of quasi-static C-V measurement for (100)-oriented substrate at room temperature on a structure with a SiO$_2$ thickness of 100 nm. There was no indication of minority-carrier effects (inset). High frequency measurements on the same substrate exhibited similar curves. Structures on this substrate demonstrated anomalously negative VBF$_{BF}$'S;

FIG. 11 is a graph of C-V data for (100) oriented substrate at 1 MHz in the dark and during illumination with 20 W cm$^{-2}$ of 254 nm light from a low pressure Hg lamp. SiO$_2$, thickness was 100 nm, and the substrate was held at 250° C. The insert shows conduction and valence bands biased into depletion. Ultraviolet light is believed to produce electrons from bulk traps in the diamond;

FIG. 12 is a graph of leakage current versus bias voltage for (100) oriented substrate in the dark and illuminated by 20W cm$^{-2}$ of 254-nm ultraviolet light. Curves were obtained for a substrate temperature of 25° C., but no substantial change occurred when the temperature was increased to 300° C. The increase in leakage current under illumination is about a factor of two smaller on (100) than on (111) oriented substrates;

FIGS. 13a and 13b are graphs of C-V measurements at 10 kHz for a (100) oriented substrate at 25° C. and 300° C. plotted as (13a) C versus bias voltage (Q is plotted for a similar structure at 200° C.) and (13b) $C^{-2}$ versus bias voltage. $N_A$ and $V_{FB}$ were obtained by fitting depletion data I to the theoretical C-V curve (see FIG. 9(b));

FIG. 14 is a graph of positive stepping (curve A) and negative-stepping (curve B) plots of normalized capacitance versus bias voltage for (100) oriented substrate at 399° C. The difference between the two curves is believed to be due to traps at the interface or in the SiO$_2$. Positively charged, long-lived traps cause displacement of curve A to the left, while mobile ions would cause displacement to the right;

FIG. 15 is a graph of $V_{FB}$ thickness. $V_{Fb}$ values were calculated from C-V data for four (100) oriented substrates and one (111) oriented substrate at 300° C. with 10- and 20-kHz signal frequencies, respectively. The SiO$_2$ thickness was calculated from the metal-SiO$_2$ diamond structure's capacitance under negative bias. Error in determining $V_{FB}$ is the result of error in determining the SiO$_2$ thickness and doping variation in the natural diamond;

FIG. 16 is an energy diagram of metal SiO$_2$ diamond structure for (100) oriented substrate. $E_c$ is the minimum energy of electrons in the conduction band, $E_v$ is the maximum energy of electrons in the valence band, and $E_F$ is the the Fermi energy level. A lower estimate of the positive interface trap level density is plotted versus energy (the energy axis coincides with the SiO$_2$ diamond interface);

FIGS. 17a and 17b are graphs of C-V data for (111) oriented substrates plotted as (17a) C and Q versus bias voltage and (17b) $C^{-2}$ versus bias voltage. Capacitance was determined with a 20 kHz signal. Calculated data (curves) were fitted to experimental data (points) by assuming $N_A = 10^{15}$ cm$^{-3}$, d=89.5 nm and $V_{FB} = 0$ V The Al electrode of the structure was 100 μm$^{-2}$, and the substrate was held at 300° C.;

FIG. 18 is an energy diagram of metal SiO$_2$ diamond structure for (111) oriented substrate;

FIG. 19 is a graph of acceptor number density versus depletion depth. Values of $N_A$ were calculated from C-V data for (100) oriented substrates at 300° substrates at 300°. The apparent increase in acceptor concentration near the surface is due to interface traps and holes accumulating at the interface, which were not considered in the calculations. Arrows indicate positions of maximum depletion depth into Si and diamond of metal SiO$_2$semiconductor structures if minority carriers accumulate at the SiO$_2$ semiconductor interface.

Other advantages and features will become apparent from the following description of the preferred embodiment and from the claims.

DESCRIPTION

The present invention is based on our discovery that high quality insulating films of silicon dioxide may be formed on semiconductor diamond substrates preferably by deposition of the insulator using CVD.

Figure 1:
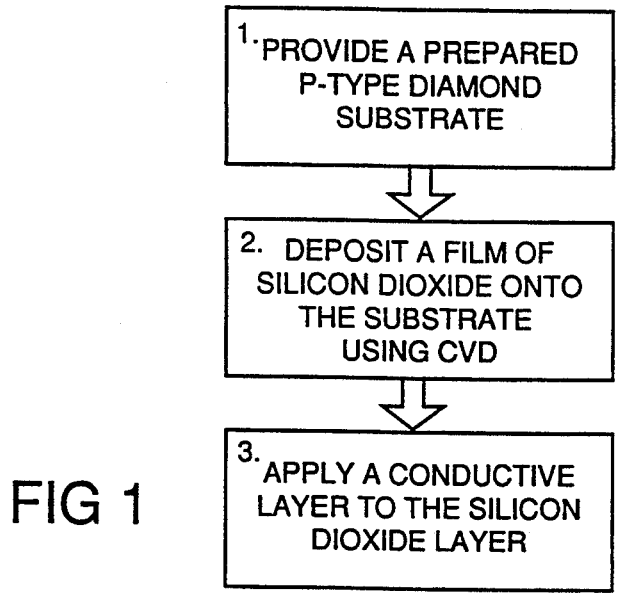
FIG. 1 is a flow diagram showing three preferred steps of the formation of silicon dioxide films in practice of the present invention.

Referring to FIG. 1, there is provided a flow diagram of the preferred method of forming a silicon dioxide film on diamond substrates including, (step 1) providing a prepared p-type diamond substrate, (step 2) depositing the dioxide film by CVD and (step 3) applying a conductive layer to the silicon dioxide film.

By the practice of steps 1-2, an electrical quality silicon dioxide film may be formed on the diamond surface. In step 3, a conductive layer is formed upon the film which facilitates application of a voltage through the silicon dioxide film to the semiconductor diamond.

The diamond substrate upon which the film is to be deposited is first prepared by cleaning, as, for example, in an oxygen plasma asher (step 1). The CVD process (step 2) involves heating the diamond substrate, preferably to about 620° C., in a gaseous mixture of, for example, SiH$_4$ and one of or a mixture of CO, CO$_2$ or O$_2$ and possibly including an inert buffer gas, for example Ar or N$_2$. Silicon dioxide is formed from the reactions taking place, and this resulting product then deposits onto the diamond substrate surface to form a high quality film.

It should be noted that, alternatively, in the case of an n-type diamond substrate a film of CaF$_2$ or BaF$_2$ may be deposited instead of silicon dioxide (step 2). In the case of N-type diamond, the conduction band of the diamond substrate is of higher energy than the conduction band of silicon dioxide. The oxide would then become a sink for electrons in the semiconductor and no charge carrier channel could form and production of MOS devices would thus be impossible. On the other hand, the conduction band of CaF$_2$ and BaF$_2$ is of higher energy than the conduction band of n-type semiconductor diamond. Carrier channels and MOS devices may thereby be constructed. Application of the CaF$_2$ or BaF$_2$ layers may be carried out by conventional thermodeposition techniques.

In the final step, (step 3), a conductive layer of, for example, aluminum, chrome-gold, or phosphorus or boron-doped polysilicon is applied to the silicon dioxide surface. Preferably, this is also done by vapor deposition, accomplished by heating the desired metal in a vacuum until it vaporizes, then condensing the metal on a lower temperature substrate to form a smooth film.

Figure 2:
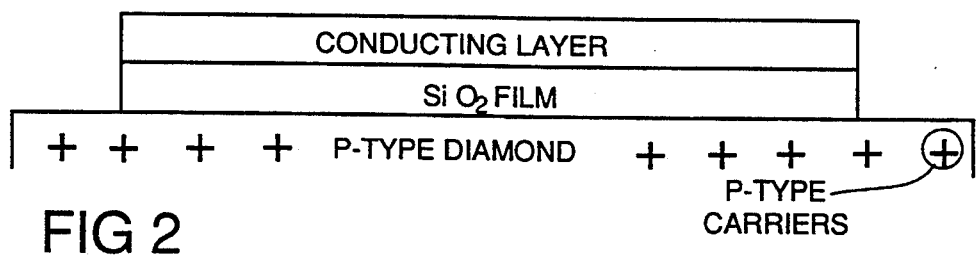
FIG. 2 is a plan view of a diamond substrate upon which a silicon dioxide film has been formed in practice of process steps 1-3 of FIG. 1.

FIG. 2 is a cross-sectional view of the diamond substrate after performing the steps 1–3 in FIG. 1. The SiO$_2$ film is shown deposited upon the p-type diamond substrate with a conducting layer applied over the SiO$_2$ film.

Figure 3A:
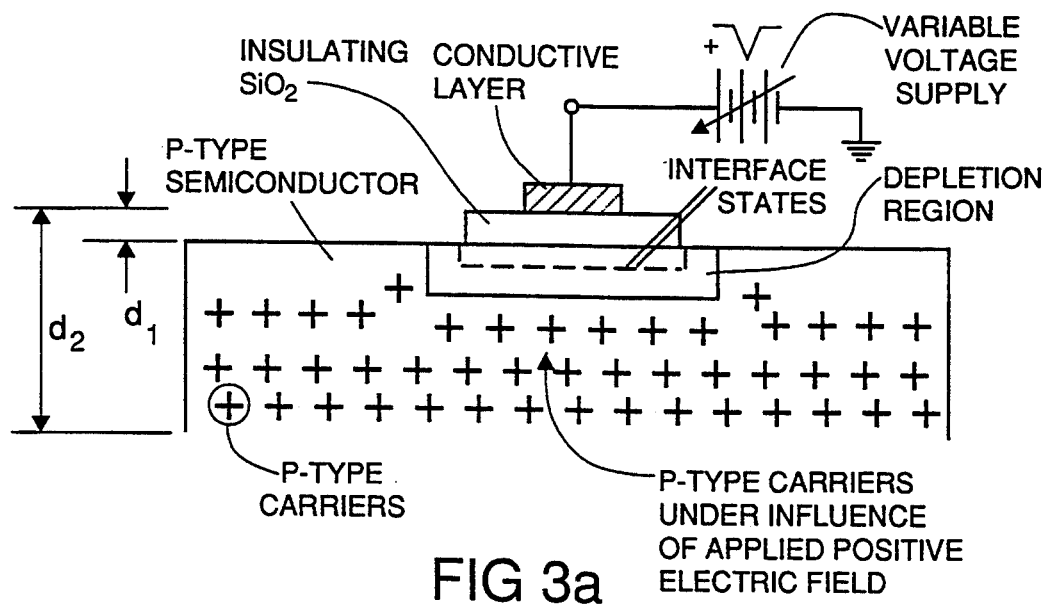
FIG. 3a is a schematic view of a semiconductor with an insulating film illustrating the presence of interface charge states.
Figure 3B:
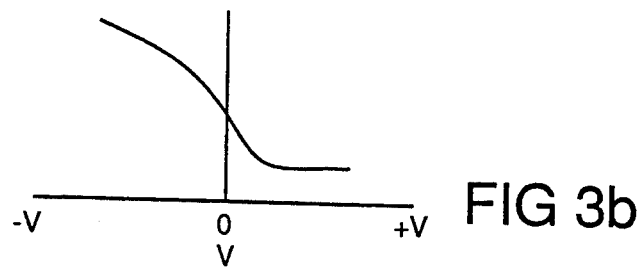
FIG. 3b is a plot of capacitance as a function of voltage for an ideal MOS structure under the influence of an applied voltage.
Figure 6:
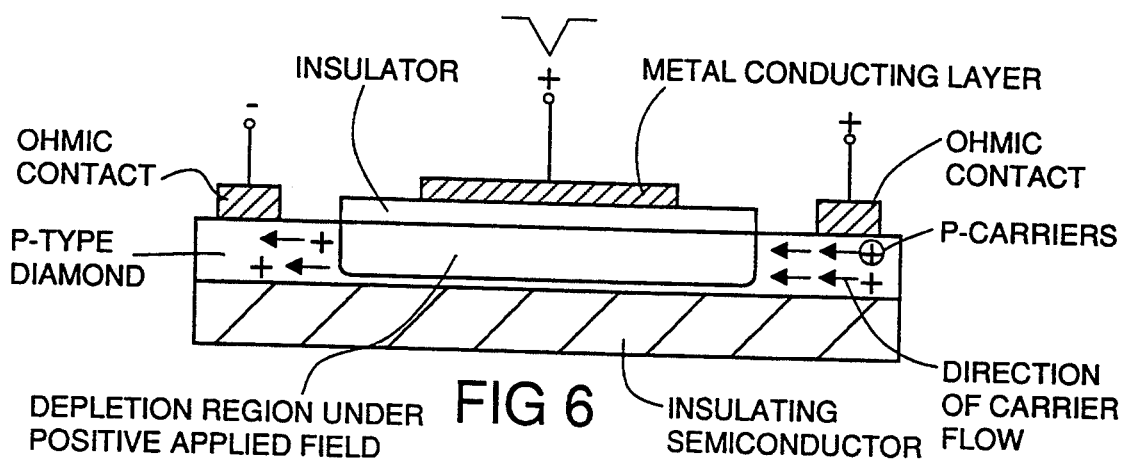
FIG. 6 is a three terminal p-channel switching device employing a diamond semiconductor and a silicon dioxide film prepared according to the present invention.

Referring now to FIGS. 3a and 3b, the effect of interface states on the control of semiconductor carriers will be discussed. FIG. 3a shows a p-type semiconductor with a thin insulating silicon dioxide film thereon, upon which a conducting layer has been formed. This is an MOS structure, where, if a bias voltage is applied to the conducting layer, the positive carriers of the semiconductor can be influenced via the field effect of the bias voltage. In the present example shown in FIG. 3a, a positive bias voltage tends to repel the positive carriers away from the semiconductor insulator interface causing a depletion region, which controls current flow in a three terminal device an example of which is shown in FIG. 6.

A common method for investigating both interface quality and the ability to control a semiconductor is by measurement of the capacitance of the structure as a function of bias voltage. An applied bias voltage produces an electrical field across the insulator and into the semiconductor. A small AC voltage is also superimposed upon the bias voltage. Capacitance is proportional to the resulting AC current flow. Therefore, observation of induced current at various AC frequencies enables detection of nonideal interface characteristics (typically due to the presence of interface states) if different capacitance relationships are measured for different frequencies.

FIG. 3b is a plot of capacitance as a function of bias voltage representing an ideal case where the capacitance of the system follows a well-known functional form. For negative voltages applied to a p-type semiconductor, p-type carriers (holes) will be attracted to the interface and accumulate. As is known, capacitance is inversely proportional to the distance between charges spanning a dielectric. In the case of an MOS structure with a negative applied bias voltage, for example, the capacitance is that of the insulator alone which is in turn known to be inversely proportional to its dielectric width $d_1$. As the negative bias voltage is decreased, a depletion of the positive carriers occurs near the interface creating a dielectric space, such as the depletion region shown in FIG. 3a; the measured capacitance now decreases as the effective dielectric width $d_2$ increases.

In the nonideal case, interface states at the semiconductor-insulator interface may be present. These states, thought to be created by the interruption of the periodic lattice structures at the surface of the crystal, are capable of changing charge by accepting or donating charge carriers with the semiconductor and may initially be positive, negative or neutral. At certain applied voltages, different interface states may donate electrons (and thereby become positive) or accept electrons (and thereby become negative). In the presence of these interface states, a different applied voltage than in the ideal case is therefore necessary to observe the same capacitance, since the electric field applied at the conductive layer must overcome the effect of the charge of the interface states. As a result, the capacitance versus voltage curve may be shifted or perturbed and may deviate from the ideal relationship shown in FIG. 3b. In the worst case, the influence of the surface states prevents control of the semiconductor carriers.

Furthermore, the frequency at which the semiconductor may be influenced by the bias voltage is affected by the charge-change time constant of the interface states. At high frequencies, relative to the time constant of the interface state charge change, the capacitance versus bias voltage relationship is transparent to the effects of the interface states since the charge change cannot keep pace with the AC voltage changes. As the AC frequency is lowered such that it is near or below the charge change time constant, the effects of these charge changes on the measured capacitance will be observed. In a device quality MOS structure, substantially free of interface states, the capacitance versus bias voltage curve should be unaffected by a change in the AC voltage frequency.

The degradation of performance of the MOS structure due to the presence of surface states is manifested in several ways. First, a higher voltage is required to effect capacitance reduction (i.e. formation of a depletion region). Secondly, stability of device characteristics (e.g., bias level, operating frequency, etc.) of an MOS device may be reduced as a result of the charge exchange between the semiconductor and the interface states, if the charge states have taken on a negative charge. A review of the effects, methods for measurement and theory relating to surface states on MOS structures may be found in *Physics of Semiconductor Devices*, 1981, John Wiley, New York by Sze.

Figure 4:
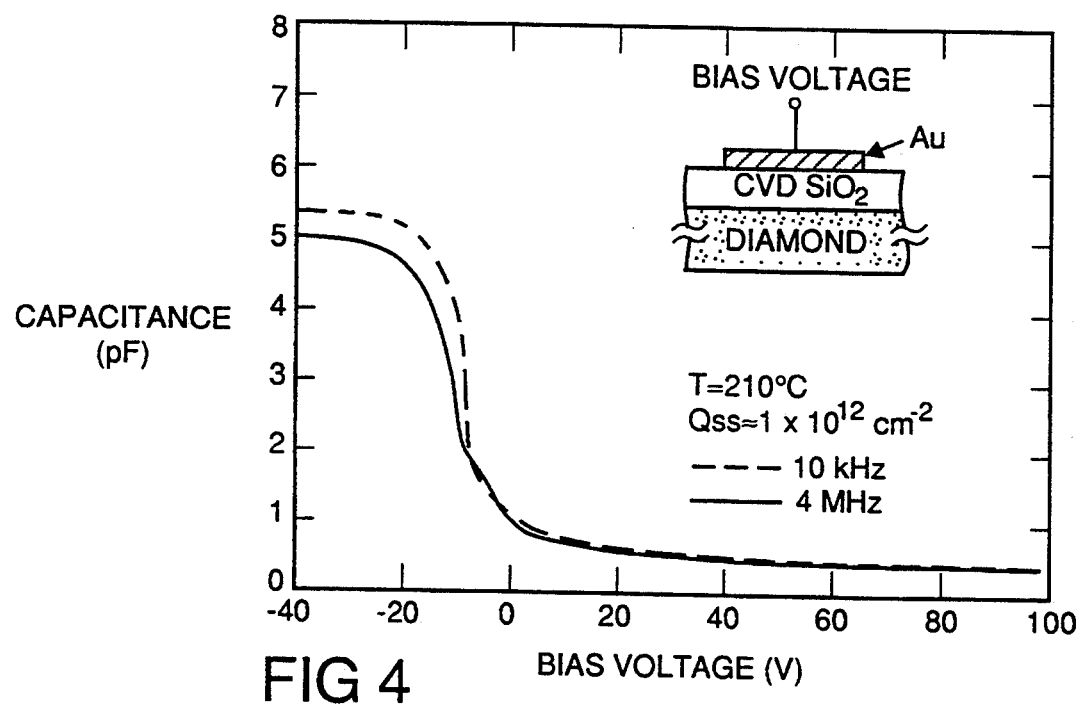
FIG. 4 is a plot of the capacitance as a function of bias voltage for two different frequencies for a diamond substrate with a silicon dioxide film prepared according to the present invention.

Referring now to FIG. 4, the capacitance of an MOS structure, prepared according to the steps of the invention described in FIG. 1, versus the bias voltage varied at two different AC frequencies, is plotted. In the present example, the thickness of the silicon dioxide layer is 0.1 $\mu$m. It will be appreciated that the curves show near ideal functional dependence of the capacitance on the bias voltage for both the higher frequency of 4 MHz (solid line) and the lower frequency, 10 KHz (dotted line).

Figure 5:
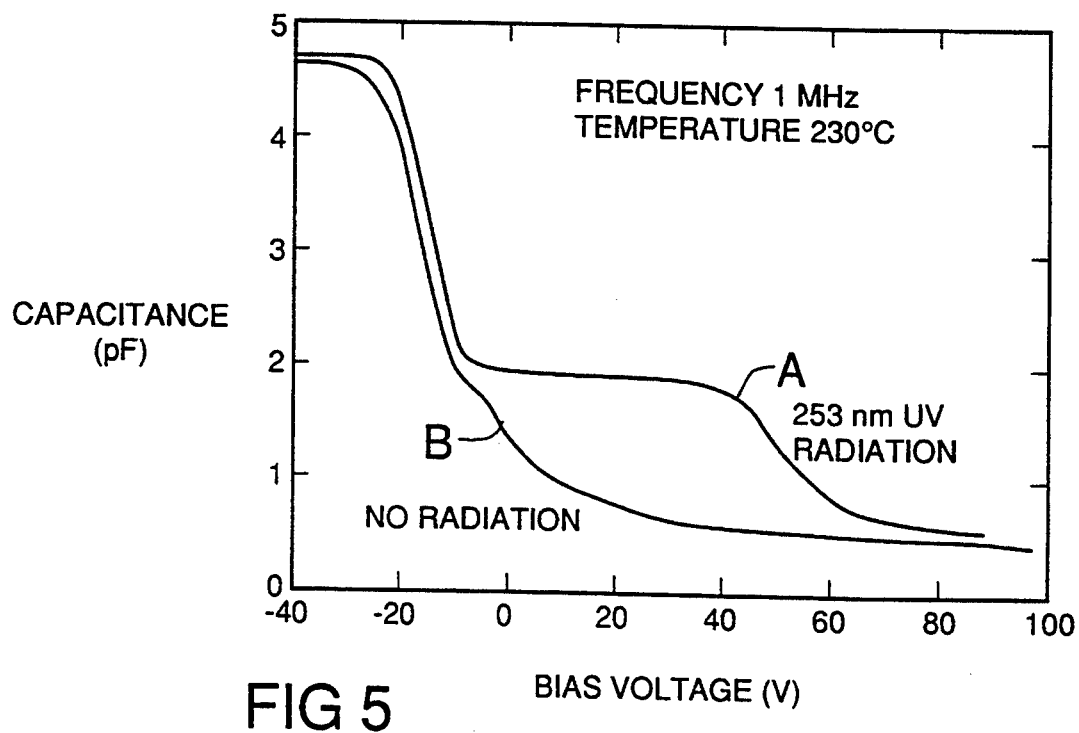
FIG. 5 is a plot of the capacitance as a function of bias voltage in the presence and absence of ambient radiation for a diamond substrate with a silicon dioxide film prepared according to the present invention.

Referring now to FIG. 5, a similar plot of capacitance versus bias voltage is provided for a diamond MOS structure produced according to the present invention for which data in the presence (A) and absence (B) of UV radiation at 254 nanometers is provided.

In MOS devices employing other semiconductors, ambient radiation affects the capacitance measurement by creating photo-induced electron-hole pairs. As is evident in FIG. 5, in diamond MOS structures produced according to the invention, such effects are also present (as indicated by the perturbed region of the A curve), and indicates the presence of the surface inversion layer required for some three-terminal devices.

In FIG. 6, a schematic of a three terminal switching device employing a diamond MOS structure is shown, having a first and second ohmic contact and a bias contact (indicated by V+) on the metallized layer atop the MOS structure. Applying a potential across the ohmic contacts in such a device may induce a flow of holes. The flow of holes in the p-type diamond will be in the direction of the arrow when the bias voltage at the bias electrode of the MOS structure is negative. Application of a positive bias voltage (V+) the carriers in the semiconductor, effectively creating a depletion region and preventing the carrier flow, as shown in FIG. 6.

Figure 7:
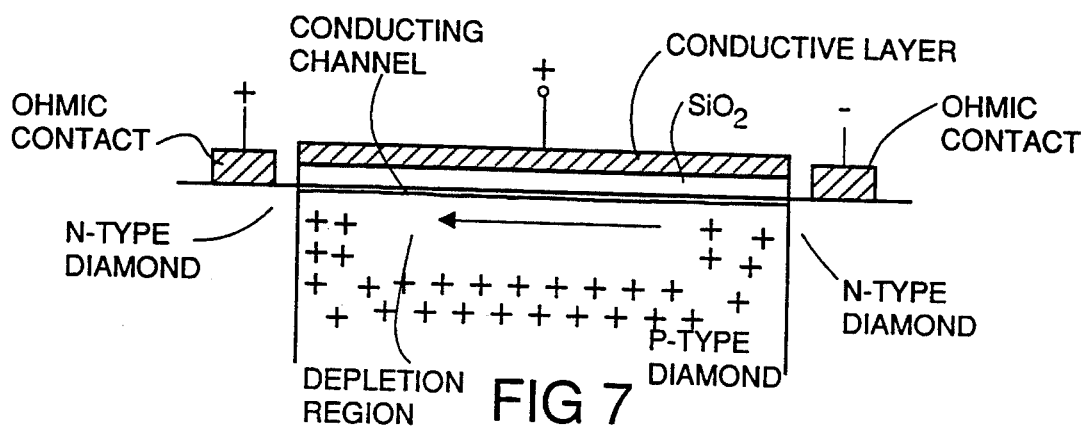
FIG. 7 is a three terminal channel switching device employing a diamond semiconductor and an insulator film prepared according to the present invention.

An NPN-type gate device in practice of the present invention is shown in FIG. 7 having a region of p-type semiconductor diamond (with an MOS junction) positioned between two n-doped regions, the latter each with an ohmic contact. A positive potential applied to the metal contact of the MOS structure inverts the interface region in the semiconductor and near the insulator, which then allows electrons from the N regions to drift into this inversion region (under the influence of a potential difference applied to the ohmic contacts), thereby effectively shorting the channel between the two n-doped regions and allowing current to flow. A negative potential applied to the MOS metal layer eliminates the inversion region, repels negative charges, and breaks the short, thereby preventing current flow.

An advantage to the use of CVD for applying films to surfaces is that the thickness of the film may be carefully controlled. Hence, in another aspect of the present invention, the deposition of silicon dioxide on a diamond surface by CVD is used to produce a thin film approximately 10 nanometers thick. Upon this film, a conducting layer of gold, aluminum or tungsten is applied. It is our observation that such a thin silicon dioxide film between the metal and semiconductor produces a diode-type (rectifying) Schottky contact on the diamond surface.

Figure 8:
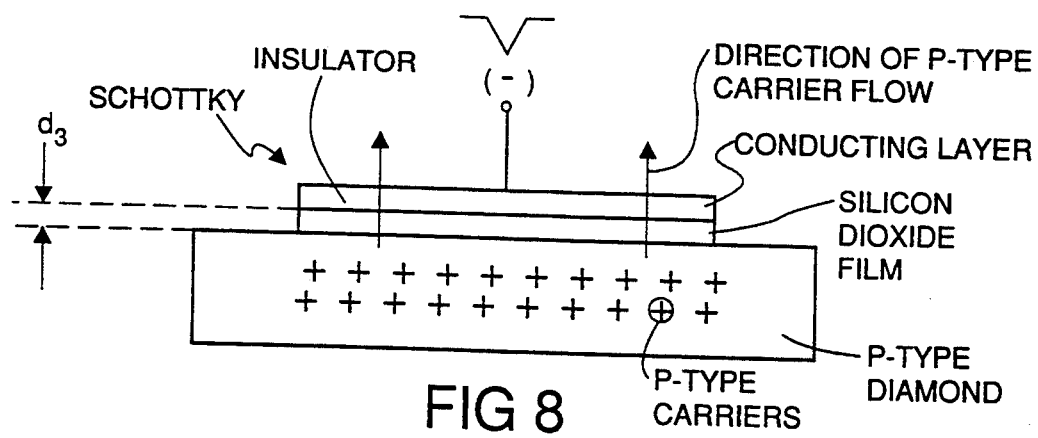
FIG. 8 is a Schottky contact formed according to the invention.

In FIG. 8, such a Schottky (rectifying) contact is illustrated. Where a 10 nanometer silicon dioxide film ($d_3$) is applied to a diamond surface by CVD (as aforementioned) and a conducting film is applied onto the film silicon dioxide. A negative potential applied to the conducting layer induces positive carriers from the p-type diamond semiconductor to flow through the contact, as indicated by the arrows in FIG. 8. A positive potential applied to the conducting layer induces no carrier flow of either sign through the contact, because there is a barrier to positive carriers flowing from the metal into the semiconductor.

Interface Characterization

The following experiments were carried out to characterize the $SiO_2$-diamond interface and investigate optimal uses.

A. General

The $SiO_2$-diamond interface was electrically characterized as a function of the orientation of the diamond substrate crystal structure by using (100)- or (111)-oriented substrates and by measuring the capacitance between the metal electrode and the diamond substrate as a function of bias voltage. Capacitance-voltage (C-V) characteristics were measured for various $SiO_2$ thicknesses and substrate temperatures, with and without exposure to ultraviolet light.

As discussed in detail below, when biased into depletion, the metal $SiO_2$-diamond structures showed no indication of minority-carrier electrons accumulating at the $SiO_2$-diamond interface. This is believed to be due to the low electron generation rate in the diamond and the barrier for electrons to enter the $SiO_2$ from the diamond conduction band. For (100)-oriented substrates, the capacitance varied with temperature near accumulation, but showed no significant change in depletion. Exposure of (100)-oriented substrates to ultraviolet light, which generates conduction band electrons in diamond, resulted in the accumulation of electrons at the $SiO_2$-diamond interface, which affected the C-V measurements. On the other hand, this light had no substantial effect on the (111)-oriented substrates, because of the absence of a barrier for electrons to enter the $SiO_2$. From the C-V measurements, the conduction band of diamond was determined to be 2.3 eV below and 0.7 eV above vacuum level for (100)-and (111)-oriented substrates, respectively. For (100)-oriented diamond substrates, the $SiO_2$-diamond interface is of device quality, and the minimum conduction-band energy of diamond is found to be 1.4 eV below that of $SiO_2$. For (111)-oriented substrates this energy for diamond is 1.6 eV above that for $SiO_2$. Metal $SiO_2$-diamond structures on (100)-oriented substrates are therefore preferably used for depletion-mode metal-oxide-semiconductor field-effect transistors (FET's, e.g., three terminal switching devices as taught above), while (111)-oriented substrates are preferably used as robust cold cathodes. (Cold cathodes are generally discussed in "Diamond Cold Cathodes" M. W. Geis, et al, *Electron Device Letters,* August, 1991, 12:456, which is incorporated herein by reference. Also incorporated by reference is pending U.S. application Ser. No. 07/823,989, filed Jan. 22, 1992, which discusses diamond cold cathode devices. Preferably, the diamond substrate in the case of a cold cathode is N-type diamond.

B. Fabrication

The C-V measurements were performed on structures fabricated with (100)- and (111)-oriented, type IIb natural diamond substrates obtained from Dubbeldee Corp. (Mount Arlington, N.J.). Type IIb diamond contains boron, which acts as an acceptor, making it a p-type semiconductor [2]. (Articles referred to herein by number are identified in Section G below.) All substrates were polished on castiron wheels using a diamond slurry in oil, by a technique similar to that described by Emanuel [3]. Laue X-ray characterization was used to ensure that the (100)- or (111)-oriented crystal planes were within 5° of the polished diamond surface. The diamonds were plasma-ashed using a gas mixture of 2% $O_2$, in He, cleaned in 200° C. solution of $(NH_4)_2S_2O_8$ and $H_2SO_4$, and rinsed in water and in acetone. The $SiO_2$ films were formed on the diamond substrates in an atmospheric-pressure chemical-vapor-deposition (CVD) system using a gas mixture of $SiH_4$, Ar, $N_2$, and $O_2$. It is believed an acid cleaning step is important to good device performance. Deposition was generally performed at 625° C. on (100)-oriented substrates and at 425° C. on (111)-oriented substrates.

For (100) oriented substrates, no significant difference was found for one case with $SiO_2$ deposited at 425° C. However, for several experiments run on (111) oriented substrates the $SiO_2$ deposition temperature was increased from 425° C. to 625° C., and this increase corresponded with a shift to large negative values of $V_{FB}$, suggesting that the higher deposition temperature of the $SiO_2$ caused either a considerable increase in the positive fixed charge or a change in the work function. It is believed that other insulating materials and methods can be used. For example, a low temperature (room temperature) deposited $SiO_2$ may be provided, e.g., by sputtering. Polymeric organic insulators may also be used, e.g., polyethylene. Other possible insulators include silicon nitride.

Adhesion of the SiO$_2$ films to diamond is of concern, since the potential for diamond oxidation and gas bubble formation exists during the SiO$_2$ deposition. The films as deposited herein showed no indication of bubbles, and adhered well to both (100) and (111) oriented substrates. Even when the films were heated to 1200° C. on (100) oriented substrates, no evidence of degradation was visible. The film can be scratched off with tungsten probes, but this requires considerable pressure in excess of that needed to make contact to the Al electrodes. Although no obvious chemical reaction occurs on the diamond surface during SiO$_2$ deposition, when the film is removed in an aqueous solution of HF, the remaining diamond surface appears to be slightly roughened. When a second SiO$_2$ film is deposited on this rougher surface, the C-V curves exhibit an increase in trap density. The increase in trap density may also be due to the formation of SiC film on the diamond. Any graphite would be removed by the diamond substrate's precleaning.

The SiO$_2$ was thinned in small regions on the substrates with buffered HF to allow C-V measurements with various thicknesses of SiO$_2$ on the same substrate. Metal contacts consisted of 1-$\mu$m-thick, electron-beam-evaporated Al or Au deposited on the SiO$_2$. No attempt was made to anneal out possible radiation damage caused by electron-beam evaporation. Standard photolithography and wet-chemical-etching techniques were used to define 100-$\mu$m$^2$ or 100×150-$\mu$m metal contacts for high-frequency measurements and 360-$\mu$m contacts for quasi-static C-V measurements. Indium or silver-doped conductive epoxy was used to form ohmic contacts on the backs of the substrates.

C. Measurement Methods

High-frequency and quasi-static techniques were used to determine the capacitance of the metal-SiO$_2$-diamond structures as a function of bias voltage. The high-frequency technique uses a 10-kHz to 4-MHz, small-voltage (<0.6 V rms) sine-wave signal. After each measurement, requiring about 1 s, the bias voltage on the structure is changed and the capacitance is remeasured. The quasi-static technique ramps the bias voltage at 0.2 V·s$^{-1}$, measures the current flow 1 through the structure and determines C from the relation 1=C dV/Dt, where dV/dt is the rate of change of the bias voltage. The C-V measurements were made between 25° C. and 399° C. A Hewlett-Packard 4275A multi-frequency inductance-capacitance-resistance (LCR) meter and a Hewlett-Packard 4140B pA meter/dc voltage source were used for the high-frequency and quasi-static C-V measurements, respectively.

By fitting the theoretical curves to the C-V data, the diamonds were determined to have acceptor concentrations varying from 10$^{15}$ to 5×10$^{16}$ cm$^{-3}$. The activation energy of the acceptors was 0.35 eV [2], resulting in a highly resistive semiconductor (10$^3$ $\Omega$·cm), since at room temperature only 0.2% of these acceptors contribute holes to the valence band. However, at 300° C. about 10% of the acceptors are ionized, and the resistance can be <$\Omega$·cm. The structures were characterized by a quality factor Q, expressed as Q=(RC$\omega$)$^{-1}$, where R is the equivalent series resistance and $\Omega$ is the signal frequency (in rad·s$^{-1}$). When Q<1, reliable capacitance measurements were difficult to obtain. In order to avoid unacceptably low Q, whenever possible low frequencies (10–20 KHz), heated substrates to ionize the acceptors, small-area (10$^{-4}$ cm$^2$) metal contacts, and large-area (2×10$^{-2}$ cm$^2$) ohmic contacts were used. When Q<1, the C measurements were considered to have excessive experimental uncertainty and were not used for analysis. The low Q's in these cases is believed to be a result of resistance of these substrates rather than the interface character.

The theoretical curves in FIGS. 9 and 17 and the calculations of V$_{FB}$ are based on the assumption that all acceptors are ionized, but in these experiments only about 10% were ionized, even at 300° C. However, if the acceptor ionization and recombination time constants are assumed to be shorter than the period of the signal frequency used to determine the capacitance, no error of consequence is made by assuming that all acceptors are ionized. For our experimental conditions, the ionization and recombination time constants are expected to be on the order of 10 ps [15]. Further, while obtaining the work function by extrapolation of V$_{FB}$ to zero SiO$_2$ thickness, can be problematical due to inhomogeneous fixed charge in the SiO$_2$. No indication of this problem was encountered.

D. (100)-Oriented Substrate

Typical C-V data for (100)-oriented substrates were compared with theoretical curves (FIGS. 9a and 9b) obtained from Sze [4, ch. 7, eqs. (20), (25), and (49)]. Curve A was calculated assuming deep-depletion conditions for positive bias, i.e., no minority-carrier conduction-band electrons are present in the semiconductor (n$_{po}$=O), so holes are the only mobile charge carriers. Curve A was fitted to the data by adjusting the acceptor number density N$_A$, the SiO$_2$ thickness d, and the flat-band voltage V$_{FB}$. The same conditions were used to determine curve B, but with the assumption that conduction-band electrons were formed in the depletion region and were localized at the SiO$_2$-diamond interface. For this case, the n$_{po}$ at zero potential was estimated from Sze [4, ch. 1. eqs, (19) and (35)] to be 4×10$^{-23}$ cm$^{-3}$. These calculations require knowledge of the bandgap energy (5.5 eV), the temperature (250° C.), and the effective density of states in the conduction and valence bands. The effective density of states in the valence bands N$_v$ was calculated assuming three bands with 0.70, 1.06, and 2.18 equivalent electron masses [5]. The effective density of states in the conduction bands N$_c$ was assumed to be equal to N$_v$=3×10$^{20}$ cm$^{-3}$. (For the case of metal-SiO$_2$-Si structures, either curve A or B could be obtained depending on the minority-carrier generation rate in the Si and on the experimental conditions [6], [7]).

The excellent agreement between the data and curve A indicates that conduction-bands electrons do not affect the C-V measurements, because the rate at which they are generated by mid-bandgap, bulk traps are too low for sufficient electrons to accumulate at the SiO$_2$-diamond interface. Assuming that these diamond substrates have minority-carrier lifetimes on order of 500 ps [8] at 400° C., and that the structure is biased to form a depletion depth of 1 $\mu$m, well over 100 years would be required to generate sufficient electrons to cause a measurable change in capacitance; this can be determined from equations in Sze [4, ch. 2, eq. (47)]. Quasi-static C-V measurements, shown in FIG. 10 are qualitatively similar to the data in FIG. 9, with no indication of minority carriers or substantial interface states.

Electrons can be generated in diamond with ultraviolet light at wavelengths 300 nm [9]. FIG. 11 shows the effect of this light on (100)-oriented substrates. Illumination of the metal SiO$_2$ diamond structure in depletion leads to accumulation of electrons at the SiO$_2$ diamond interface, which pin the potential at the interface near flat-band conditions, resulting in a capacitance that is independent of bias voltage. The electrons may be free to move at the interface or may be captured by acceptor traps either on the interface or within the $SiO_2$ layer. As the bias voltage increases, however, the electron loss from the interface into the $SiO_2$ also increases. When this loss exceeds the electron generation rate, the potential at the interface becomes more positive, causing the depletion layer to increase and the capacitance to decrease. For a barrier height of 1.4 eV from diamond to $SiO_2$ minimum conduction-band energies and a $SiO_2$ film thickness of 100 nm, the electron loss by Fowler-Nordheim tunneling into the $SiO_2$ increases substantially for bias voltages >40 V, as estimated from van der Ziel [10, eq. (7.33)]. As shown in FIG. 11, this is the approximate voltage at which the capacitance starts to decrease under ultraviolet light. A typical example of leakage current as a function of bias voltage is shown in FIG. 12. The leakage current of a structure exposed to light increases substantially only when the electrode is positively biased, which is consistent with the electrons in the diamond flowing into the $SiO_2$. Visible light had no effect on either leakage current or C-V measurements, although the shoulder at $-5$ V on the curve representing no illumination (FIG. 11) suggests that the effect exists at a lower level without light. When the ultraviolet light is discontinued, leakage current and capacitance return to the values obtained without illumination during the measurement period of 0.3 to 1 s.

The effect of temperature on the C-V characteristics is shown in FIGS. 13a and 13b. Temperature has a large effect on capacitance near accumulation (FIG. 13a), but there is little variation in the curve when the metal electrode is negatively biased in deep depletion (FIG. 13b). Also presented in FIG. 13a is a plot of Q measured at 200° C. which shows a dip near accumulation between $-5$ and $-10$ V, which may be attributed to interface traps. These traps are believed to be responsible for the variation of capacitance with temperature. C-V curves obtained at 300° C. show little or no change when the high-frequency signal used to measure the capacitance is increased from 10 kHz to 4 MHz, but at 25° C. there is substantial change for frequencies above 100 kHz. (This may be due either to the high resistance of the substrate and the resulting low Q or to interface traps (states) with ionization time constants comparable to the signal frequency.) The presence of these traps may decrease performance of some enhancement mode devices (MOSFET transistors), but it is not believed they are entirely debilitating. As the results show, enhancement mode devices operate better at higher temperatures (e.g., 300° C.). The traps generally will not affect depletion mode devices.

The $V_{FB}$ can be calculated by fitting the C-V data to the theoretical curve, as seen in FIG. 9b, but the accuracy is compromised by traps, mobile ions (such as Na), and doping variations in the natural diamonds. The hysteresis between two curves, one starting with the most positive bias voltage and stepping it negatively, and the other starting with the most negative voltage and stepping it positively, 30 can be as much as 5 V near accumulation for bias voltages from $-20$ to 0 V. Hysteresis of the curves shown in FIG. 14 is an indication of traps with ionization time constants >1 s. However, in depletion the hysteresis is usually within experimental error for bias voltages >0 V, and in this region the C-V characteristic is assumed to be independent of traps and mobile ions. For a uniformly doped semiconductor in depletion, a plot of $C^{-2}$ as a function of bias voltage should approximate a straight line [7] (see FIG. 9b). Since the local internal doping densities of the natural diamond substrates used in these experiments varied by more than a factor of three, about one-third of the curves obtained for the metal-$SiO_2$ diamond structures showed considerable deviation from a straight line. To avoid substantial experimental uncertainty, only depletion C-V data for bias voltages from 0 to 70 V, with a linear-correlation coefficient [11] greater than 0.997, were used in the calculations of $V_{FB}$. Even with this restriction, internal doping variations created some experimental uncertainty.

The calculated $V_{FB}$ as a function of $SiO_2$ thickness is shown in FIG. 15. The slope of the least square straight-line fit to the data is proportional to the effective fixed charge at the interface, which is $2\pm2\times10^{10}$ cm$^{-2}$. Extrapolation of the $V_{FB}$ to zero $SiO_2$ thickness gives a work function difference between the diamond substrate and the aluminum electrode of $3.2+0.4$ eV from these data, the energy levels of (100) oriented-substrate structures were determined as shown in FIG. 16. The energy levels of the Al and $SiO_2$ were obtained from Deal et al. [12]. The data indicates that quality of the interface is not substantially effected by the $SiO_2$ thickness.

A lower limit estimate of the interface-trap level density (FIG. 16) was obtained from the temperature variation of the C-V curves shown in FIG. 13a. The difference in capacitance may be due either to change in the distribution of the inhomogeneous fixed charge or to the variation of the ionization time constants. At 25° C., the ionization time constants are assumed to be considerably longer than the period of the signal used to determine the capacitance When the structure is heated to 300° these time constants decrease and are presumed to be shorter than the signal period. Further, the $V_{FB}$ is assumed to be the same at 25° C. and 300°, which is consistent with the calculated values of $V_{FB}$ at these temperatures (see FIG. 13b). On these bases, the difference in capacitance between the low and high temperature curves at the same voltage can be contributed to the variation of the ionization time constants. The lower limit of the trap level density was then calculated using Castagn and Vapaille's technique [13] [14], under the assumption that the low frequency C-V curve used in their calculations is equivalent to our high temperature C-V curve used in their calculations is equivalent to our high temperature C-V curve. The hysteresis shown in FIG. 14 indicates that interface traps with long time constants may still exist at 399° C. Thus, the calculated interface trap level density is a lower limit of the actual density. As discussed above, the trap level does not effect depletion mode devices and is not debilitating for enhancement mode devices.

If, on the other hand, the low temperature C-V curve arises from an inhomogeneous distribution of fixed charge in the oxide, the change in C-V behavior with temperature seen in FIG. 13a, suggests that the new charge becomes more uniform at higher temperatures due, perhaps, to accelerated tunneling or diffusion.

E. (111) Oriented Substrate

The characteristics of the $SiO_2$ diamond interface differ for (111) and (100) oriented substrates, as demonstrated by a comparison of FIGS. 17a and 17b with FIGS. 9a and 9b. In depletion, there is no linear relation between $C^{-2}$ and bias voltage with (111) oriented substrates, as there was with (100) oriented substrates. Further, ultraviolet light causes no substantial change in the C-V curves, suggesting the absence of a barrier to electrons entering $SiO_2$ from the diamond substrate. Also, the decrease in Q for bias voltages from 0 to 10 V indicates the possibility of a greater number of mid-bandgap interface traps for (111) oriented than for (100) oriented substrates. These traps make it difficult to calculate $V_{FB}$ from the deep depletion portion of the C-V curve as was done for the (100) oriented substrates. However, since the capacitance does not vary substantially with temperature in accumulation and the hysteresis for this orientation is usually less than a volt, $V_{FB}$ can be estimated from the bias voltage at the flat-band capacitance.

Flat band capacitance $C_{FB}$ was calculated from Sze [4, ch. 7, sqs. (7) and (26)] by assuming $N_A = 10^{15}$ cm$^{-3}$, the value for the (111) oriented substrates that most nearly fits the C-V curve near FBC. Two C-V curves were used to estimate $V_{FB}$. One was obtained by starting with the most positive bias voltage and stepping it negatively, and the other by starting with the most negative voltage and stepping it positively. A fixed charge of $-7 \times 10^9$ cm$^{-2}$ and a $V_{FB}$ of $-0.39$ V (extrapolated to zero $SiO_2$ thickness) were determined from the C-V curves using a positive bias starting voltage. A fixed charge of $5 \times 10^{10}$ cm$^{-2}$ and a $V_{FB}$ of 0.36 V were obtained using a negative starting voltage. The average $V_{FB}$ for both polarities at a given $SiO_2$ thickness is shown in FIG. 15. From the slope of the least square straight line fit to the data, the fixed charge at the interface was estimated to be $0 \pm 5 \times 10^{10}$ cm$^{-2}$, and the work function difference between diamond and Al was $0.0 \pm 0.5$ V. The energy levels for (111) oriented diamond, $SiO_2$, Al, and vacuum are shown in FIG. 18. Note that under these conditions the conduction band of diamond is 1.6 eV above that of $SiO_2$, so light generated electrons will not be trapped at the $SiO_2$ diamond interface.

F. Analysis

The low fixed charge and interface trap level density for (100) oriented substrates indicate that these structures are satisfactory for depletion mode devices. Acceptor number density as a function of depth, shown in FIG. 19, was obtained from typical C-V data using [14, eqs. (9,10) and (9,11)] of Nicolian and Brews. For comparison, the positions of maximum depletion into semiconducting Si and diamond are shown for strongly inverted surfaces. The maximum depletion depths were calculated using [4, ch. 7, eq. (28)]. The high trap level density for bias voltages <0 V makes the metal $SiO_2$ diamond structure less desirable for enhancement mode FET's. The lack of a barrier for conduction-band electrons to enter $SiO_2$, makes (111)-oriented diamond substrates less practical for n-channel FET's. However, $SiO_2$ on (100)-oriented substrates or other insulations with higher conduction band energies may be useful for n-channel devices.

The energy difference between vacuum level and conduction bands for (100)- and (111)- oriented diamond surfaces in contact with $SiO_2$ was $2.3 \pm 0.4$ and $-0.7 \pm 0.5$ eV, respectively. Although experimental uncertainty from interface traps and incomplete data on doping variations caused additional error in the determination of electron affinities, these results are believed to be within 0.6 V of the actual values. The $SiO_2$ diamond interface for (100) oriented substrates was found to be of device quality and acceptable for depletion mode, p-channel FET's. The similarity between the high and low temperature data indicates that the threshold voltage of such devices will not vary by more than about 0.3 V over the temperature range from 25° C. to 300° C., although the percentage of ionized acceptors may vary by three orders of magnitude over the same range. The (111) oriented diamond surface maintains its negative electron affinity, even after processing in a CVD $SiO_2$ reactor. This result indicates that (111) oriented diamond substrates are particularly useful for robust cold cathodes.

G. List of References

The following references are hereby incorporated by reference:

[1] Geis et al., "Summary abstract: Device applications of diamonds," *J. Vac. Sci Technol.*, vol A6, pp. 1953-1954, 1988.

[2] Collins et al., "Electrical Properties," in J. E. Field, *The Properties of Diamonds*, New York: Academic Press, 1979, pp. 79-105.

[3] Emanuel, *Diamond and Precious Stones*, New York; Putman, 1873.

[4] Sze, *Physics of Semiconductor Devices*, 2nd ed, New York; Wiley, 1981, ch. 7.

[5] Rauch, "Millimeter cyclotron resonance in diamonds," in *Proc. Int. Conf. on the Physics of Semiconductors*, A. C. Strickland, Ed, London: The Institute of Physics and The Physical Society, 1962, pp. 276-280.

[6] Grove et al., "Investigation of thermally oxidized silicon surfaces using metal-oxide-semiconductor structures," *Solid-State Electron*, vol 8, pp 145-163, 1965.

[7] Goetzberger et al., "MOS avalanche and tunneling effects in silicon surfaces," *J. Appl Phys.*, vol. 38, pp. 4582-4588, 1967.

[8] Ho et al., "A diamond opto-electronic switch," *Opt Commun.*, vol. 46, pp. 202-204, 1983.

[9] Denham et al., "Ultraviolet intrinsic and extrinsic photoconductivity of natural diamond," *Phys. Rev.*, vol. 161, pp. 762-768, 1967.

[10] van der Ziel, *Solid State Physical Electronics*, 2nd ed, Englewood Cliffs, N.J.; Prentice-Hall, 1968, pp. 144-146.

[11] Bevinton, *Data Reduction and Error Analysis for the Physical Sciences*, New York, McGraw-Hill, 1969, pp. 120-122.

[12] Deal et al., "Barrier energies in metal-silicon dioxide-silicon structures," *J. Phys Chem solids*, vol. 27, pp. 1873-1879, 1966.

[13] Castagn et al., "Description of the $SiO_2$ Si interface properties by means of very low frequency MOS capacitance measurements," *Surface Sci.*, vol. 28 pp. 157-193, 1971.

[14] Nicollian et al , "MOS (Metal Oxide Semiconductor)," in *Physics and Technology*, New York, Wiley, 1982, pp. 331-333.

[15] Smirnova et al., "Long-lived excited states of boron in diamond," *Sov. Phys.-Semicond.*, vol. 21, pp. 774-777, 1987.

[16] Wei et al., "Photoelelectric emission and work function of semiconducting diamond," *Carbon*, vol. 13, pp. 425-430, 1975.

[17] Himpsel et al., "Quantum photoyield of diamond (111) A stable negative-affinity emitter," *Phys. Rev.*, vol. B20, pp. 624-627, 1979.

[18] Pate et al., "The diamond (111) surface; A dilemma resolved," *Physica,* vols. 117B and 118B, pp. 783-785, 1983.

[19] Pate et al., "Formation of surface states on the (111) surface of diamond," *J. Vac. Sci. Technol,* vol. 19, pp. 349-354, 1981.

[20] Pate et al., "Very strong lattice coupling in diamond at photon energies up to 1.5 eV above the hand gap," in *Proc. 17th Int. conf. on the Physics of Semiconductors,* Chadi/Harrison Eds., New York; Springer-Verlag, 1985, pp. 1181-1184.

[21] Pate, "The diamond surface; Atomic and electronic structure," *Surface Sci.,* vol. 165, pp. 83-142, 1986.

[22] Glover, "The C-V characteristics of Schottky barriers on laboratory grown semiconducting diamonds," *Solid-State Electron.,* vol 16, pp. 973-983, 1983.

Geis, "Capacitance-Votlage Measurements on Metal-SiO$_2$-Diamond Structures Fabricated with (100)-and (111)-Oriented Substrates", *IEEE, Transactions on Electron Devices,* 38:3 (March 1991).

Other embodiments are in the claims.

What is claimed is:

1. A semiconductor diamond field-effect transistor device that is substantially free of operational effects from interface states, comprising:

a diamond semiconductor substrate having mobile semiconductor charge carriers, a CVD-deposited non-epitaxial silicon dioxide insulating film having a thickness of about 0.1 μm or less on said diamond substrate, and a conducting layer on said insulating film for imposing an electric field in said substrate through said film, said film enabling the formation of a predetermined depletion region in said substrate for control of said mobile carriers when electrical fields are imposed through said film by said conducting layer, said device being substantially free of operational effects due to interface states as characterized by a capacitance versus bias voltage relationship that is substantially unaffected by a change in the frequency of said bias voltage over about 4 KHz to 10 MHz.

2. The device of claim 1 wherein said film is SiO$_2$.

3. The device of claim 1 wherein said diamond semiconductor substrate is made of p-type diamond and said CVD-deposited film is on a (100) surface.

4. The device of claim 3 wherein said conducting layer is selected from the group consisting of doped polysilicon and a metal.

5. The device of claim 4 wherein said metal is aluminum, chrome-gold or tungsten.

6. The device of claim 2 or 3 wherein the thickness of said film is determined to inhibit substantial tunneling of charge carriers through said film.

7. The device of claim 6 wherein said device is incorporated into a depletion mode field effect transistor.

8. The device of claim 7 wherein the thickness of said film is between about 10 to 100 nm.

9. The device of claim 4 wherein the thickness of said insulating film is less than or equal to approximately 10 nanometers for forming a rectifying contact.

10. A semiconductor diamond field-effect transistor device that is substantially free of operational effects from interface states, comprising:

a diamond semiconductor substrate having a (111) surface and mobile semiconductor charge carriers, a CVD-deposited non-epitaxial silicon dioxide insulating film having a thickness of about 0.1 μm or less on said (111) surface of said diamond substrate, and a conducting layer on said insulating film, said film enabling control of said mobile carriers in said diamond substrate when electrical fields are imposed on said film through said conducting layer, said device being substantially free of operational effects due to interface states, said device characterized by a capacitance versus bias voltage relationship that is substantially unaffected by a change in the frequency of said bias voltage over about 4 KHz to 10 MHz.

11. The device of claim 10 wherein said conducting layer is selected from the group consisting of doped polysilicon or a metal.

12. The device of claim 10 wherein said metal is aluminum, chrome-gold or tungsten.

13. The device of claim 10 or wherein said device is incorporated in a cold cathode.

14. A semiconductor device comprising an N-type diamond semiconductor substrate and a means for controlling semiconductor charge carriers, said means comprising an insulating film selected from the group consisting of CaF$_2$ or BaF$_2$ on said diamond substrate, and a means for imposing an electric field in said substrate through said film, said film enabling the formation of a predetermined depletion region in said substrate for control of said mobile carriers in said diamond substrate when electrical fields are imposed on said film.

15. The device of claim 14 wherein said film has a thickness of about 100 nm or less.

16. The device of any one of claims 14 or 15 wherein said device is a three terminal switching device.

17. The device of any one of claims 14 or 15 wherein said device is an NPN gate device.

18. A semiconductor device comprising:

a diamond semiconductor substrate having a (111) surface and means for controlling semiconductor charge carriers, said means comprising a non-diamond insulating film on said (111) surface of said diamond substrate, and a means for imposing an electric field in said substrate through said film, said film enabling control of said mobile carriers in said diamond substrate when electrical fields are imposed on said film, said film being selected from CaF$_2$ and BaF$_2$.

19. A semiconductor diamond field-effect transistor device that is substantially free of operational effects from interface states, comprising a diamond semiconductor substrate having mobile semiconductor charge carriers, a CVD-deposited non-epitaxial silicon dioxide insulating film having a thickness of about 0.1 μm or less on said diamond substrate, and a conducting layer on said insulating film for imposing an electric field in said substrate through said film, said film enabling the formation of a predetermined depletion region in said substrate for control of said mobile carriers when electrical fields are imposed through said film by said conducting layer, said device being substantially free of operational effects due to interface states as characterized by a capacitance versus bias voltage relationship that is substantially unaffected by a change in the frequency of said bias voltage over about 4 KHz to 10 MHz, said semiconductor diamond field-effect transistor device provided by a method comprising the steps of:
- providing said diamond semiconductor substrate,
- cleaning said diamond semiconductor substrate,
- heating said diamond substrate to a temperature of about 620° C., in a gaseous mixture of $SiH_4$, $O_2$ and $N_2$ to form said silicon dioxide insulating film with the total pressure being near atmospheric pressure, and
- depositing said conducting layer upon a region of said silicon dioxide insulating film.

* * * * *